(12) United States Patent
Park

(10) Patent No.: US 9,191,002 B2
(45) Date of Patent: Nov. 17, 2015

(54) DATA PROCESSING APPARATUS AND METHOD IN PLC SYSTEM

(71) Applicant: LSIS CO., LTD., Anyang-si, Gyeonggi-do (KR)

(72) Inventor: Jo Dong Park, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 20 days.

(21) Appl. No.: 14/062,258

(22) Filed: Oct. 24, 2013

(65) Prior Publication Data

US 2014/0139263 A1    May 22, 2014

(30) Foreign Application Priority Data

Nov. 22, 2012 (KR) .................... 10-2012-0133079

(51) Int. Cl.
*G05B 19/05* (2006.01)
*H03K 19/003* (2006.01)
*G05B 19/14* (2006.01)

(52) U.S. Cl.
CPC ........ *H03K 19/00392* (2013.01); *G05B 19/054* (2013.01)

(58) Field of Classification Search
CPC .............. G01R 31/318516; G01R 31/31701; G01R 31/318558; G01R 31/31921; G01R 31/31813; G06F 13/364; G06F 13/385; H03K 19/00392; G05B 19/054
See application file for complete search history.

(56) References Cited

U.S. PATENT DOCUMENTS

| | | | | |
|---|---|---|---|---|
| 6,477,606 | B1* | 11/2002 | Kawamura et al. | 710/305 |
| 2003/0214909 | A1* | 11/2003 | Maciel | 370/235 |
| 2008/0183928 | A1* | 7/2008 | Devila et al. | 710/110 |

FOREIGN PATENT DOCUMENTS

| | | |
|---|---|---|
| JP | 04-168501 | 6/1992 |
| JP | 07-287608 | 10/1995 |
| JP | 09-190345 | 7/1997 |
| JP | 2000-132289 | 5/2000 |
| JP | 2001-337914 | 12/2001 |
| KR | 1020070054017 | 5/2007 |

OTHER PUBLICATIONS

Korean Intellectual Property Office Application Serial No. 10-2012-0133079, Office Action dated Dec. 19, 2013, 3 pages.
Japan Patent Office Application Serial No. 2013-230191, Office Action dated Oct. 7, 2014, 7 pages.

* cited by examiner

*Primary Examiner* — April Y Blair
*Assistant Examiner* — Dipakkumar Gandhi
(74) *Attorney, Agent, or Firm* — Lee, Hong, Degerman, Kang & Waimey

(57) ABSTRACT

A programmable logic controller (PLC) system, and more particularly, a data processing apparatus and method in the PLC system are provided. In the data processing method in a programmable logic controller (PLC) system, first dummy code data is output to an area having a chip selection signal for valid data output. The valid data is output after the first dummy code data is output. And second dummy code data is output when the valid data output is completed.

6 Claims, 7 Drawing Sheets

(a)

| Inputs | | | Output |
|---|---|---|---|
| OE | Clock | D | Q |
| L | ⌐ | H | H |
| L | ⌐ | L | L |
| L | L,H,⌐ | X | No Change |
| H | X | X | Z |

X = don't care
Z = high impedance (b)

Fig.6

```
RAMarea:0x000000  ~   0x0FFFFF
#define IN0            0x000000
#define OUT0           0x000100
#define DummyBuffer    0x100000
#define Buffer0        0x100001

OutputWrite:
InterruptDisable();
BitWrite DummyBuffer    —610
BitWrite Buffer()       —620
BitWrite DummyBuffer    —630
interruptEnable();
rts
```

DATA PROCESSING APPARATUS AND METHOD IN PLC SYSTEM

CROSS-REFERENCE TO RELATED APPLICATION

Pursuant to 35 U.S.C. §119(a), this application claims the benefit of earlier filing date and right of priority to Korean Application No. 10-2012-0133079, filed on Nov. 22, 2012, the contents of which is incorporated by reference herein in its entirety.

BACKGROUND

The present disclosure relates to a programmable logic controller (PLC) system, and more particularly, to data processing apparatus and method in the PLC system.

In a PLC system using a micro processing unit (MPU) with limited input and output (I/O) ports, when I/O points get increased, the I/O ports may be expanded by using flip-flops and buffers having an information storing function. At this time, data and clock signals or enable signals are applied to the flip-flops and the buffers. In case of expanding the output ports, data and clock signals are applied to the flip-flops. The clock signals may be generated by combining a write (WR) signal and a chip select (CS) signal by using a logic circuit. In order to increase ability of the logic circuit to withstand a noise, bypass capacitors may be added for bypassing the noise.

This circuit design type may cause a signal delay due to the capacitors and the logic circuit. In addition, not data desired to be output to a data bus, but next data or data in a transition process may be output.

FIG. 1 is an operation flowchart of a related art PLC program, and FIG. 2 is a timing diagram according to a related art clock signal.

Referring to FIGS. 1 and 2, an MPU first performs an initial operation in an operation mode of a PLC system (operation S10).

The MPU collects input data to be used in performing the operation mode using the PLC program and performs an input image area refresh operation that the collected data is stored in the input image area (operation S20).

The MPU may perform the operation mode on the basis of a preset program, and store data input according to the performance of the program in the input image area. Here, an operation result may be updated in the input image area in real time (operation s30).

The MPU may perform an output image area refresh operation that data stored in an output image area according to performance of the program are sent to an output port or an output buffer (operation s40).

As described above, when data stored in the output image area is sent to the output port or the output buffer, a chip select 1 (CS1) signal, which is an address specifying signal corresponding to a buffer as shown in FIG. 2, and a WR signal transit to a low level and a clock signal output from an OR gate also transits to a low level. Due to an effect by the added capacitors to the logic circuit, like a reference numeral 210, delays 210a and 210b may occur between falling and rising times of the clock signal and falling and rising times of the WR signal. Accordingly, data 220 updated to an output Q may not be valid according to the occurrence of the delays.

That is, although a clock speed of the MPU increases, capacitors used to increase ability to withstand a noise and logic gates for clock signal generation cause signal delays. Thus, errors may occur between valid data desired to be output and actually output data.

SUMMARY

Embodiments provide data processing apparatus and method in a programmable logic controller (PLC) system for processing data in consideration of delays occurring in data processing in the PLC system.

Embodiments also provide a data processing apparatus and method for increasing reliability of data according to operations in the PLC system and easily obtaining valid data.

In one embodiment, a data processing method in a programmable logic controller (PLC) system, includes: outputting first dummy code data to an area having a chip selection signal for valid data output; outputting the valid data after the first dummy code data is output; and outputting second dummy code data when the valid data output is completed.

The details of one or more embodiments are set forth in the accompanying drawings and the description below. Other features will be apparent from the description and drawings, and from the claims.

BRIEF DESCRIPTION OF THE DRAWINGS

FIG. 6 is an exemplary program code for processing input and output data according to an embodiment.

DETAILED DESCRIPTION OF THE EMBODIMENTS

Reference will now be made in detail to the embodiments of the present disclosure, examples of which are illustrated in the accompanying drawings.

It should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the present invention, so it should be understood that other equivalents and modifications could be made thereto without departing from the spirit and scope of the present invention.

Data processing apparatus and method in a programmable logic controller (PLC) system according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

Figure 3:
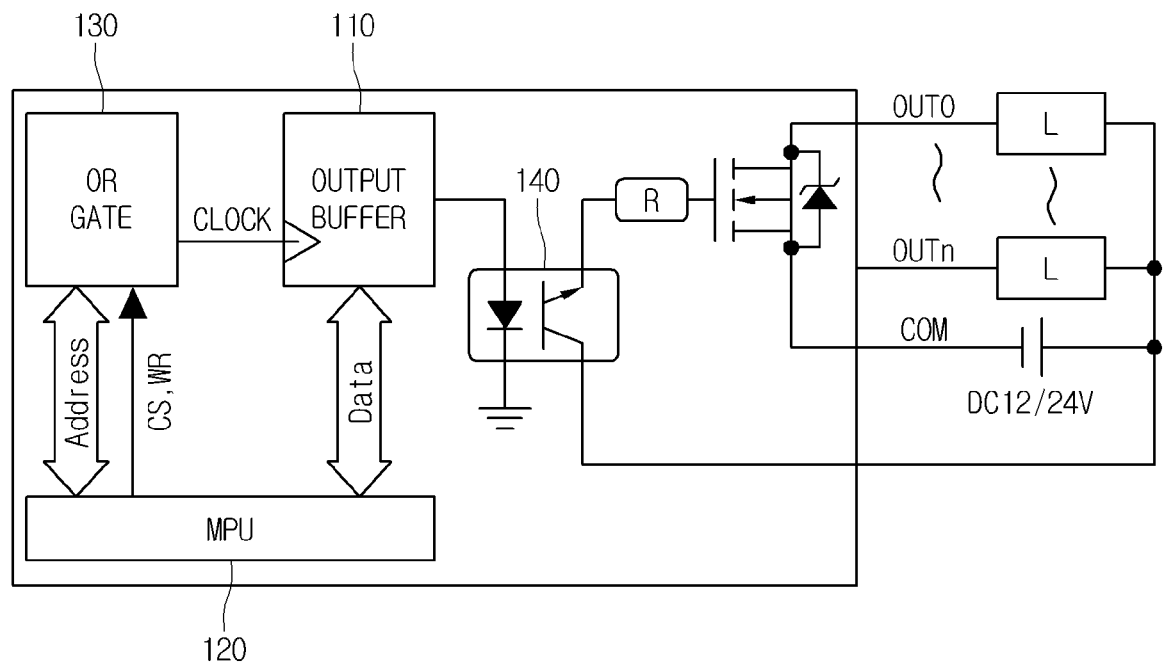
FIG. 3 is a hardware block configuration diagram for outputting data in a typical PLC system.
Figure 4:
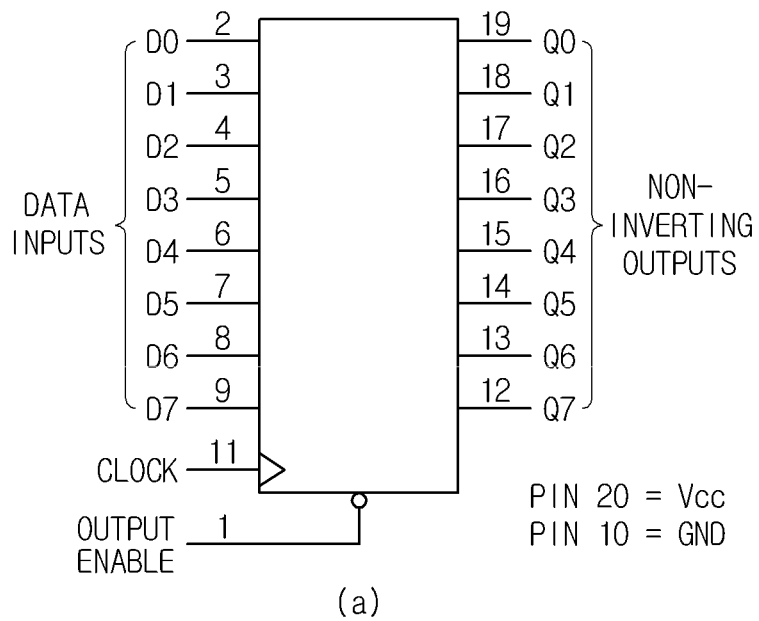
FIG. 4 an exemplary logic diagram and function table of an output buffer.

FIG. 3 is a hardware configuration block diagram for data output in a PLC system according to embodiments, and FIG. 4 is an exemplary logic diagram and function table of an output buffer.

Figure 1:
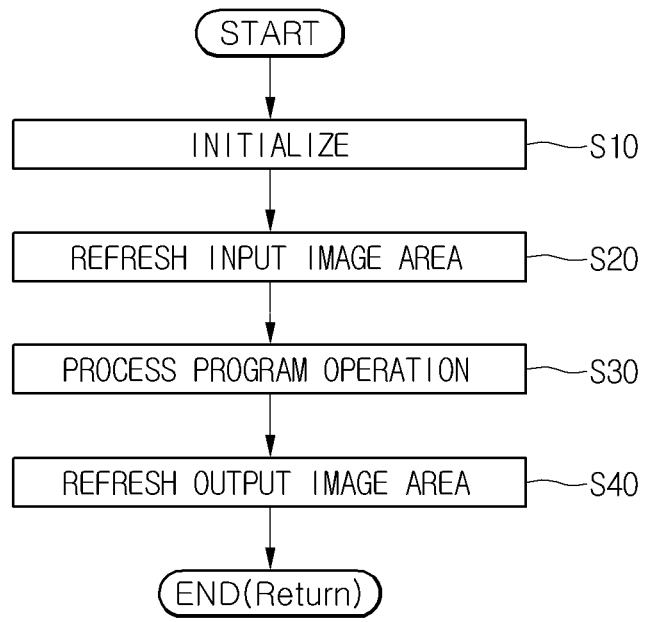
FIG. 1 is an operation flowchart of a related art programmable logic controller (PLC) program.
Figure 2:
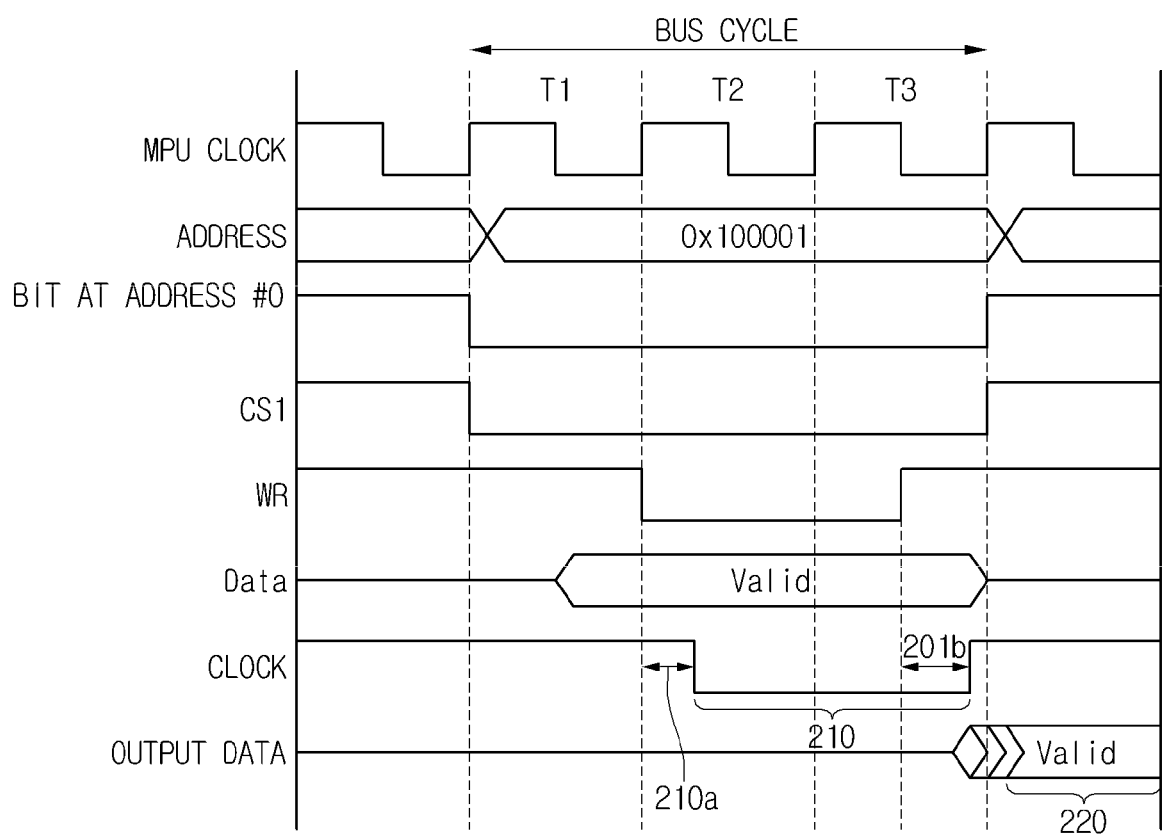
FIG. 2 is a timing diagram according to a related art clock signal.

Referring to FIGS. 3 and 4, in order to generate a clock signal to be input to an output buffer 110 in the PLC system, an address, a chip select (CS) signal, a write (WR) signal output from a microprocessing unit (MPU) 120 are input to an OR gate 130. In order for the clock signal to be a low level (Low), the address, the CS signal, and the WR signal are required to be Low. That is, as shown in FIG. 2, in a case where the output buffer is a D flip-flop, an input D may be transferred to an output Q when the clock signal rises.

When the clock signal rises from Low to a high level (High), values on a data bus are output to the output buffer 110, and then output to a photo coupler 140 to control a switching operation of the photo coupler 140.

Figure 5:
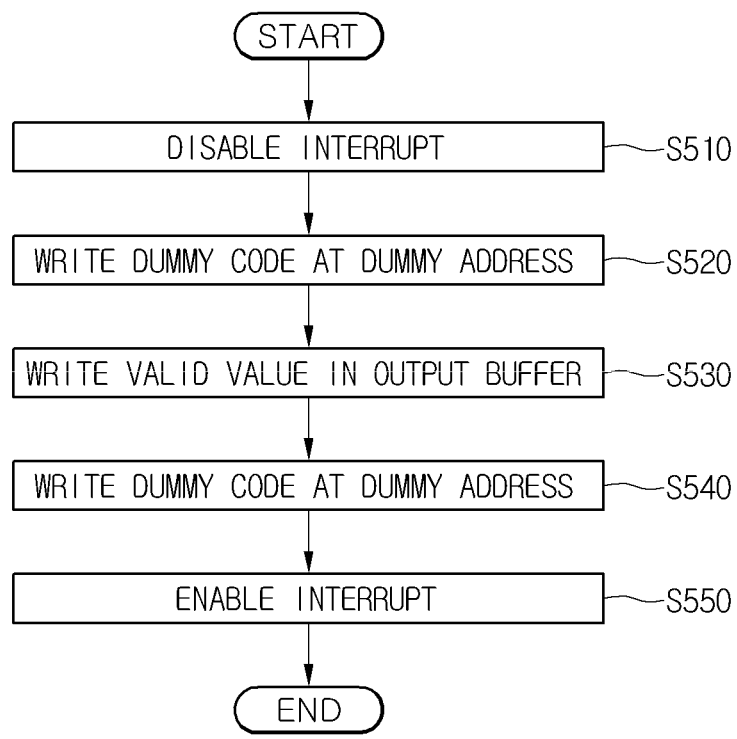
FIG. 5 is an operation flowchart of data processing in a PLC system according to an embodiment.
Figure 7:
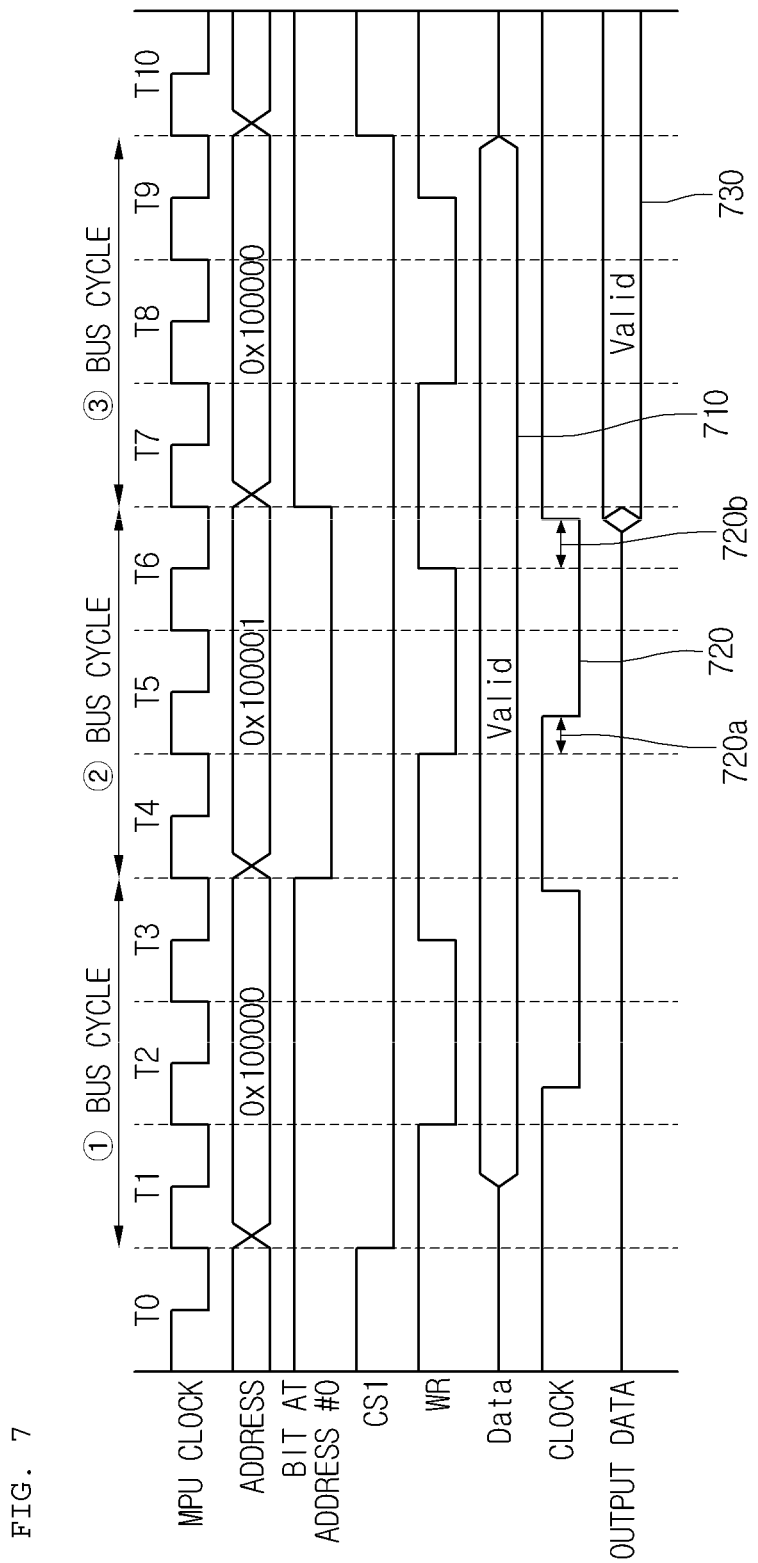
FIG. 7 is a timing diagram according to an embodiment.

FIG. 5 is an operation flowchart of data processing in a PLC system according to embodiments. FIG. 6 is an exemplary program code for processing input and output data according to an embodiment. FIG. 7 is a timing diagram according to an embodiment.

Referring to FIG. 5, in a data processing operation in the PLC system according to an embodiment, the MPU 120 disables an interrupt (operation S510), before a data output operation is performed through the output buffer during a program operation. The disabling of the interrupt by the MPU 120 is for preventing other interrupts from occupying the data bus.

Then, the MPU 120 may output dummy code data (first dummy code data) for outputting arbitrary data during a CS signal period when a valid value is written in the output buffer (operation S520). The first dummy code data may be output through the data bus before the valid value is output.

That is, a control code 610 is read from a memory (not shown), which preferentially output data as a dummy code during a first bus cycle before a second bus cycle starts. During the second bus cycle, a valid data is output to a CS1 area in FIG. 7.

The MPU 120 may read the control code 610 from the memory in order to output the valid data during the second bus cycle, when the first dummy data output is completed during the first bus cycle. That is, the MPU 120 may read a control code 620 for outputting the valid data as shown in FIG. 6 and output data to a corresponding address (operation S530).

The MPU 120 outputs dummy code data (second dummy code data) even after data is actually output similarly to a case of the first dummy code data which is output to the corresponding address before the data is actually output (operation 540). The second dummy code data may be output in order to prevent the data bus from being changed. Thus, an erroneous output, which may occur due to a data change on a rising edge of the clock signal, can be blocked and stable data can be output.

An area CS1 to which the first and second dummy codes, and the valid data are output may be the same, but output addresses may be different. In addition, the first and second dummy code data may be output during cycles as many as the number of clock cycles during which the valid data is output The MPU 120 may return to a normal state by enabling the disabled interrupt in the initial operation when the data output is completed (operation S550).

As shown in FIG. 7, when the data is output in the CS1 area by using the dummy code, a clock signal can be generated by outputting the valid data to an area desired to be output in a stable state of the data bus. At this time, even though the clock signal is delayed, the valid data is output to the CS1 area by using an additional dummy code after the valid data is output. Then the valid data can be stored in a buffer.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A data processing method in a programmable logic controller (PLC) system comprising an OR gate and an output buffer, the method comprising:
    outputting first dummy code data having a first chip address to the OR gate;
    outputting first valid data to the output buffer after the first dummy code data is output;
    outputting second dummy code data having a second chip address to the OR gate after the first valid data is output;
    outputting second valid data to the output buffer after the second dummy code data is output;
    outputting the same first dummy code data to the OR gate after the second valid data is output; and
    outputting the same first valid data to the output buffer after the same first dummy code data is output,
    wherein the first chip address is different from the second chip address.

2. The method according to claim 1, further comprising disabling an interrupt before outputting the first dummy code data.

3. The method according to claim 2, further comprising enabling the disabled interrupt when the second dummy code data is output.

4. A data processing apparatus comprising:
    an output buffer outputting data;
    an OR gate synthesizing an input signal and outputting the synthesized input signal to the output buffer as a clock signal; and
    a microprocessing unit (MPU):
    outputting first dummy code data having a first chip address to the OR gate;
    outputting first valid data to the output buffer after the first dummy code data is output;
    outputting second dummy code data signal having a second chip address to the OR gate after the first valid data is output;
    outputting second valid data to the output buffer after the second dummy code data is output;
    outputting the same first dummy code data to the OR gate after the second valid data is output; and
    outputting the same first valid data to the output buffer after the same first dummy code data signal is output,
    wherein the first chip address is different from the second chip address.

5. The apparatus according to claim 4, wherein the MPU disables an interrupt before the first dummy code data is output.

6. The apparatus according to claim 5, wherein the MPU enables the disabled interrupt when the second dummy code data is output.

* * * * *